(12) United States Patent
Wu et al.

(10) Patent No.: US 8,461,037 B2
(45) Date of Patent: Jun. 11, 2013

(54) METHOD FOR FABRICATING INTERCONNECTIONS WITH CARBON NANOTUBES

(75) Inventors: Hsin-wei Wu, Taipei (TW); Chung-Min Tsai, Taipei (TW); Tri-Rung Yew, Hsinchu (TW)

(73) Assignee: National Tsing Hua University, Hsinchu (TW)

( * ) Notice: Subject to any disclaimer, the term of this patent is extended or adjusted under 35 U.S.C. 154(b) by 279 days.

(21) Appl. No.: 13/094,388

(22) Filed: Apr. 26, 2011

(65) Prior Publication Data
US 2012/0135598 A1    May 31, 2012

(30) Foreign Application Priority Data
Nov. 30, 2010 (TW) .............................. 99141452 A

(51) Int. Cl.
*H01L 21/00* (2006.01)
(52) U.S. Cl.
USPC ............................ 438/618; 438/666; 438/677
(58) Field of Classification Search
USPC .................... 438/667, 618, 674, 677
See application file for complete search history.

(56) References Cited

U.S. PATENT DOCUMENTS

| 7,312,531 | B2 | 12/2007 | Chang et al. |
| 7,473,633 | B2 * | 1/2009 | Furukawa et al. ............ 438/622 |
| 2007/0262451 | A1 * | 11/2007 | Rachmady et al. ........... 257/758 |
| 2010/0264544 | A1 * | 10/2010 | Heo et al. ....................... 257/768 |
| 2011/0233779 | A1 * | 9/2011 | Wada et al. .................... 257/751 |

FOREIGN PATENT DOCUMENTS

| TW | 582104 | 4/2004 |
| TW | I298520 | 7/2008 |

* cited by examiner

*Primary Examiner* — Richard Booth
(74) *Attorney, Agent, or Firm* — Muncy, Geissler, Olds & Lowe, PLLC

(57) ABSTRACT

A method for fabricating interconnections with carbon nanotubes of the present invention comprises the following steps: forming a dual-layer that contains a catalytic layer and an upper covering layer on the periphery of a hole connecting with a substrate; and growing carbon nanotubes on the catalytic layer with the upper covering layer covering the carbon nanotubes. The present invention grows the carbon nanotubes between the catalytic layer and the upper covering layer. The upper covering layer protects the catalytic layer from being oxidized and thus enhances the growth of the carbon nanotubes. The carbon nanotubes are respectively connected with the lower substrate and an upper conductive wire via the catalytic layer and the upper covering layer, which results in a lower contact resistance. Moreover, the upper covering layer also functions as a metal-diffusion barrier layer to prevent metal from spreading to other materials via diffusion or other approaches.

7 Claims, 8 Drawing Sheets

METHOD FOR FABRICATING INTERCONNECTIONS WITH CARBON NANOTUBES

FIELD OF THE INVENTION

The present invention relates to a method for fabricating carbon nanotubes, particularly to a method for fabricating interconnections with carbon nanotubes.

BACKGROUND OF THE INVENTION

As the circuit density increases and the size of the semiconductor decreases, the spacing between the metal wires is consistently reduced, which introduces the problems of electrical migration and RC delay. Usually, a carbon nanotube structure can be used to solve the abovementioned problems. However, it is usually difficult to have a good connection interface and an appropriate contact resistance between a metal wire and a carbon nanotube structure.

R.O.C. patent No. I298520 disclosed a "Method for Electroplating an Interconnection Containing a Carbon Nanotube and Metal Composite Material", wherein a substrate with an interconnection formed on the surface is electroplated in an electroplating bath containing metal ions and carbon nanotubes to form a conductive wire with carbon nanotubes and metal composite material, whereby the conductive wire has better conductive connection. R.O.C. patent No. 582104 disclosed a "Self-Assembly Nano-Conductive Bump and a Method for Fabricating the Same", wherein several functional groups are added to two ends of a carbon nanotube, and the carbon nanotube is self-assembled onto a metal pad by powerful complex bonding between the functional groups and the metal pad. Different functional groups can match different metals to create a strong bonding force between the metals and the carbon nanotubes.

U.S. Pat. No. 7,312,531 disclosed a "Semiconductor Device and Fabrication Method Thereof" which proposes a semiconductor device containing wiring layers, wherein a catalyst layer is arranged between a substrate and carbon nanotubes. The catalyst layer is made of cobalt (Co) and $M_1$. $M_1$ is selected from a group consisting of W, P, B, Bi, Ni, and a combination thereof. Further, a top layer made of tantalum (Ta) or tantalum nitride (TaN) is arranged on the carbon nanotubes. The carbon nanotubes are connected to the conductive wires via the top layer to avoid the problem of high resistance. The conventional methods can exempt the interconnection structure from high resistance, disconnection, and pollution or damage to the dielectric layer. However, such a structure increases the number of fabrication steps. Furthermore, the resistance is likely to increase since the substrate interface can easily come in to contact with oxygen during the fabrication process.

SUMMARY OF THE INVENTION

The primary objective of the present invention is to provide a method to solve the problems of high resistance, electrical migration and RC delay of interconnections of semiconductor devices.

Another objective of the present invention is to provide a method which avoids a complicated semiconductor fabrication process, protects the metal interface from being oxidized, and prevents the resistance from increasing.

To achieve the abovementioned objectives, the present invention proposes a method for fabricating interconnections with carbon nanotubes with the following steps:

Step S1: forming an insulating layer on a substrate, and forming a hole on the insulating layer connecting with the substrate;

Step S2: forming a catalyst layer comprising a catalytic layer and an upper covering layer on the periphery of the hole, wherein the catalyst layer is connected with the substrate and the insulating layer;

Step S3: growing carbon nanotubes in the hole and between the catalytic layer and the upper covering layer. The carbon nanotubes are grown on the catalytic layer with a chemical vapor deposition method, and the upper covering layer covers the carbon nanotubes and is connected with a conductive wire arranged at one side opposite to the substrate.

In the present invention, the carbon nanotubes are grown between a catalytic layer and an upper covering layer through a chemical vapor deposition method. The upper covering layer protects the catalytic layer from being oxidized and enhances the growth of the carbon nanotubes. Since the carbon nanotubes are respectively connected with the lower substrate and the upper conductive wire via the catalytic layer and the upper covering layer, they have relatively low contact resistance. Furthermore, the upper covering layer can function as a metal barrier layer, and prevent metal from spreading to other materials via diffusion or other approaches. The present invention also features a simple and low-cost fabrication process.

DETAILED DESCRIPTION OF THE PREFERRED EMBODIMENTS

The embodiments and technical contents of the present invention are described in detail along with the drawings below.

Figure 1A:
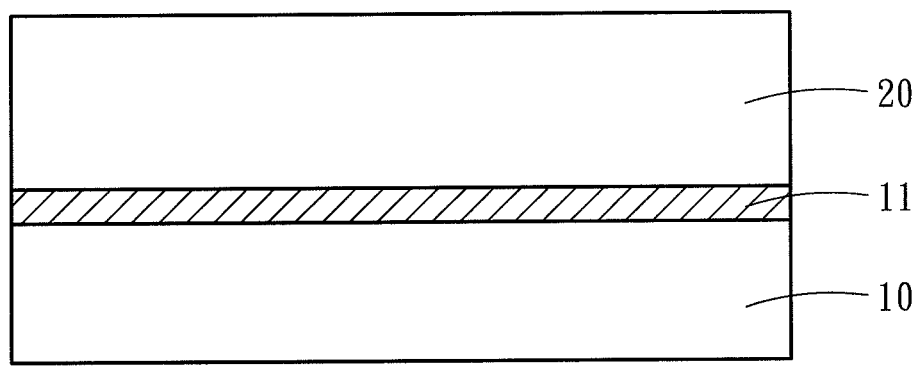
FIGS. 1A-1F are schematic diagrams showing a method for fabricating interconnections with carbon nanotubes according to one embodiment of the present invention.
Figure 1B:
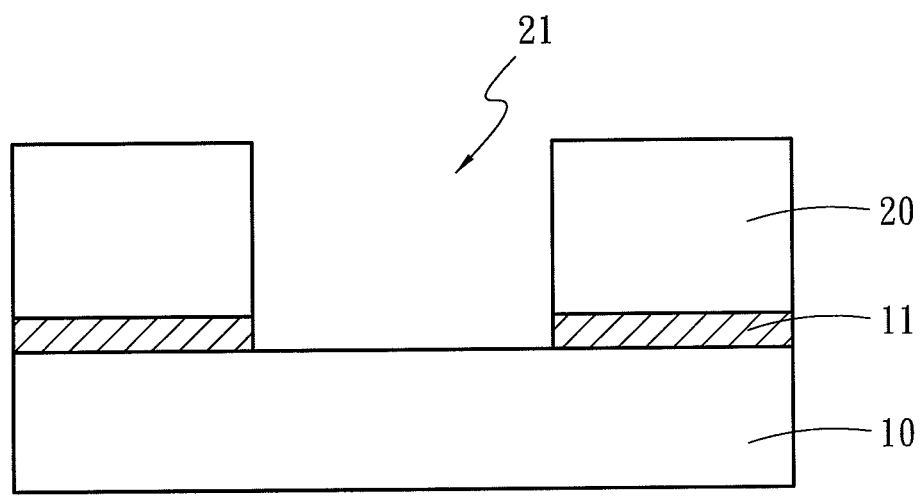
Figure 1C:
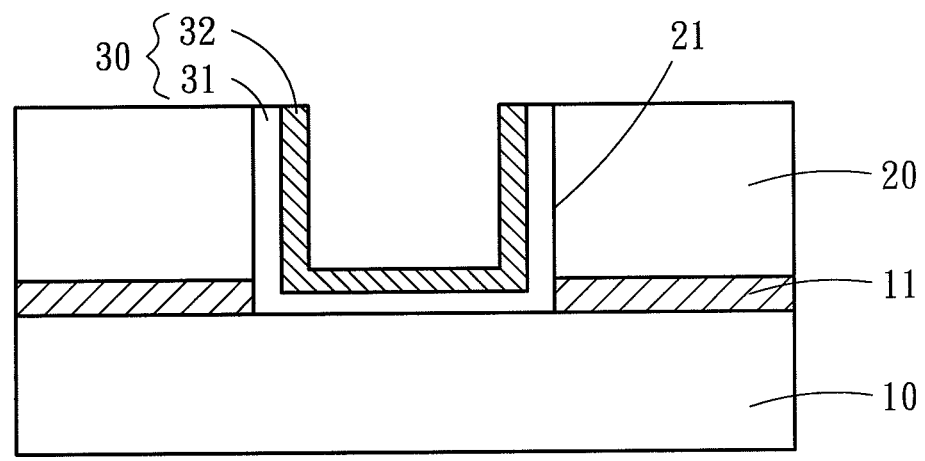
Figure 1D:
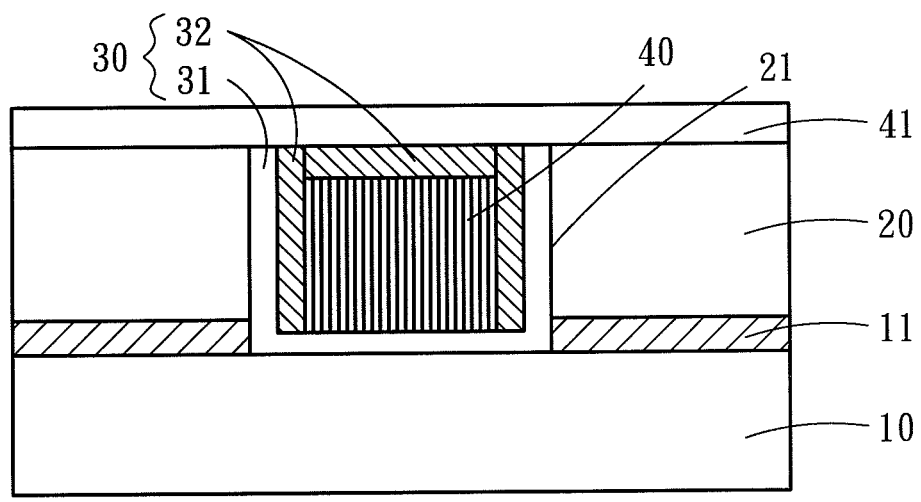
Figure 1E:
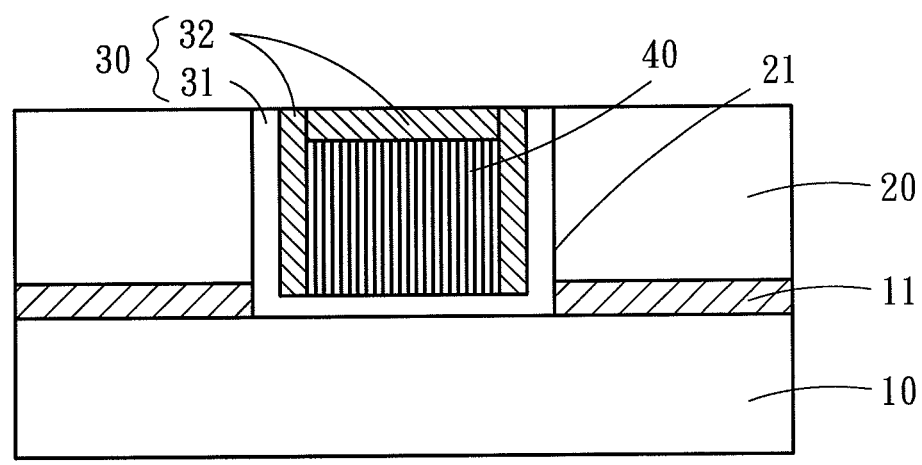
Figure 1F:
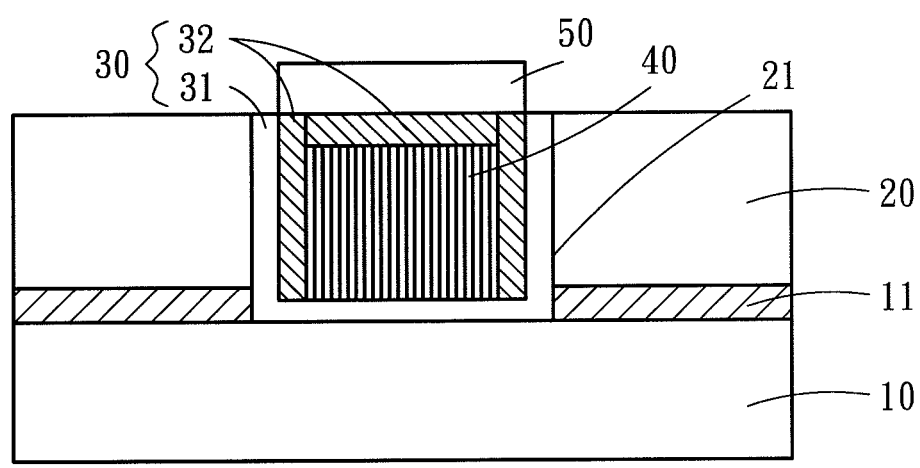
Figure 2:
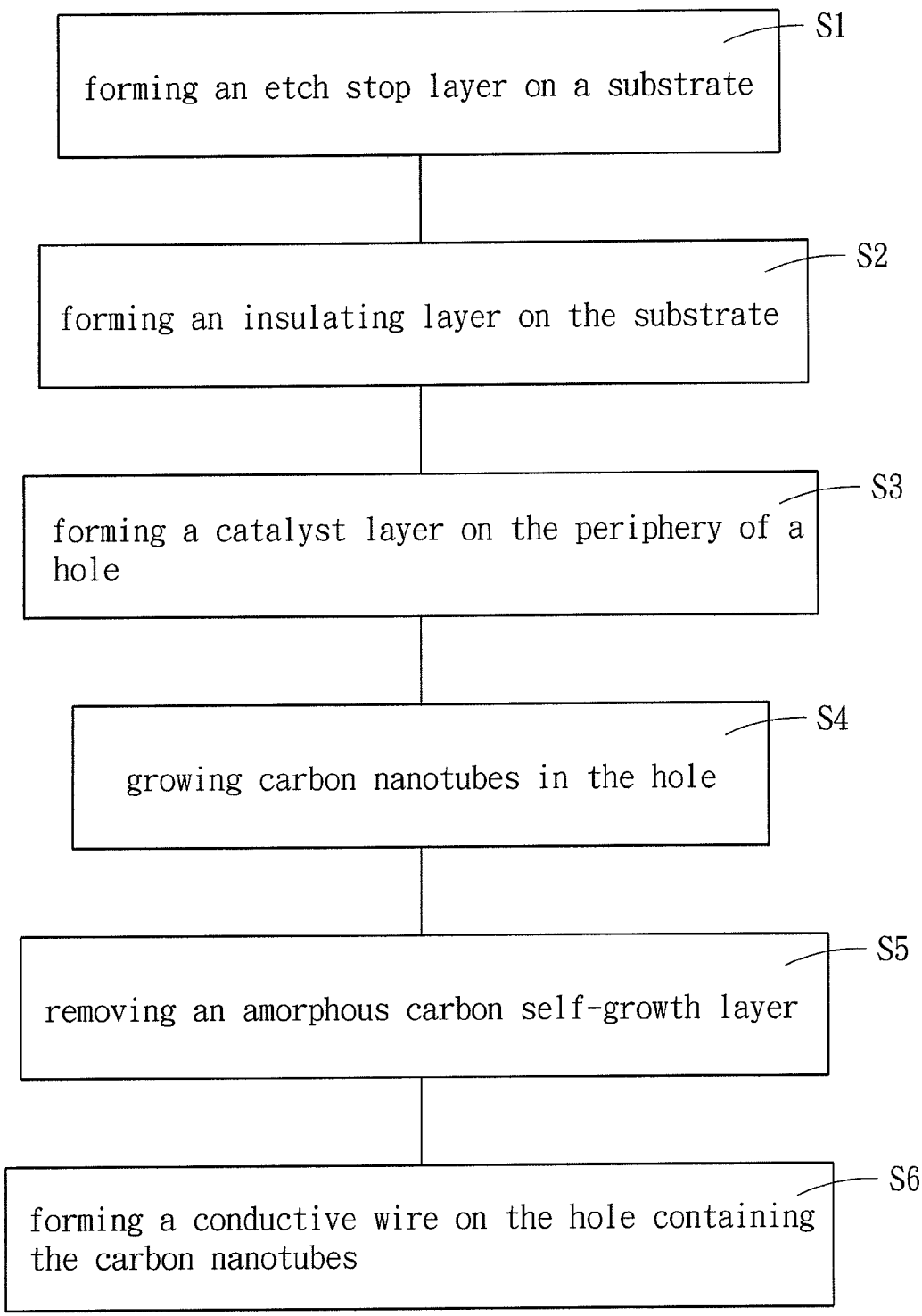
FIG. 2 is a flowchart of a method for fabricating interconnections with carbon nanotubes according to one embodiment of the present invention.

Refer to FIGS. 1A-1F and FIG. 2. FIGS. 1A-1F are schematic diagrams showing a method for fabricating interconnections with carbon nanotubes according to one embodiment of the present invention. FIG. 2 is a flowchart of a method for fabricating interconnections with carbon nanotubes according to one embodiment of the present invention. The present invention proposes a method for fabricating interconnections with carbon nanotubes, which comprises steps of:

Step S1: forming an etch stop layer 11 on a substrate 10. The substrate 10 is made of a conductive material, such as copper. The etch stop layer 11 is made of a non-conductive material and may function as a copper-diffusion barrier layer. The etch stop layer 11 is made of silicon nitride in one embodiment.

Step S2: forming an insulating layer 20 on the substrate 10 and forming a hole 21 on the insulating layer 20 connecting with the substrate 10. The insulating layer 20 is made of silicon dioxide in one embodiment. The insulating layer 20 is connected with the substrate 10 via the etch stop layer 11. The etch stop layer 11 is usually used to stop further etching so as to determine the depth of the hole 21 on the insulating layer 20 to prevent the substrate 10 from being damaged by etching.

Step S3: forming a catalyst layer 30 on the periphery of the hole 21. The catalyst layer 30 is connected with the substrate 10 and the insulating layer 20. The catalyst layer 30 contains a catalytic layer 31 and an upper covering layer 32 as shown in FIG. 1C. In this embodiment, the catalytic layer 31 is made of cobalt or nickel, and the upper covering layer 32 is made of tantalum.

Step S4: growing carbon nanotubes 40 in the hole 21. The carbon nanotubes 40 are grown between the catalytic layer 31 and the upper covering layer 32 with a chemical vapor deposition method. The upper covering layer 32 protects the catalytic layer 31 from being oxidized and thus enhances the growth of the carbon nanotubes 40. The carbon nanotubes 40 are respectively electrically connected with the lower substrate 10 and an upper conductive wire 50 via the catalytic layer 31 and the upper covering layer 32.

Step S5: removing an amorphous carbon self-growth layer 41. When the carbon nanotubes 40 are grown in a self-assembled manner, the amorphous carbon self-growth layer 41 is spontaneously grown from the carbon source of the carbon nanotube 40. The amorphous carbon self-growth layer 41 should be removed through plasma to facilitate the succeeding process.

Step S6: forming a conductive wire 50 on the hole 21 containing the carbon nanotubes 40. The conductive wire 50 is connected with the upper covering layer 32 on the surface of the carbon nanotubes 40.

Via the abovementioned steps, the interconnections in a semiconductor device can be effectively connected via the carbon nanotubes 40. The carbon nanotubes 40 are electrically connected with the lower substrate 10 via the catalytic layer 31 of the catalyst layer 30 and electrically connected with the upper conductive wire 50 via the upper covering layer 32 of the catalyst layer 30.

Figure 3:
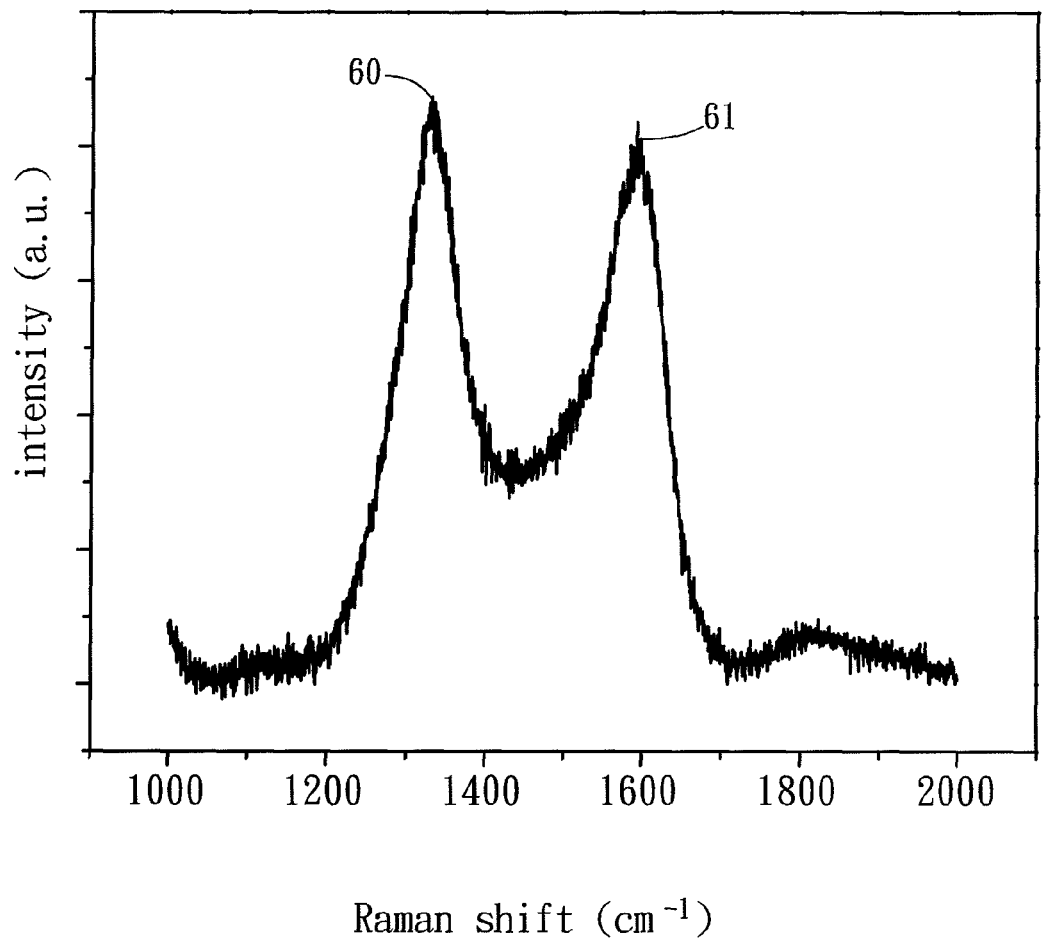
FIG. 3 is a diagram showing a Raman shift according to one embodiment of the present invention.

Refer to FIG. 3 a diagram showing a Raman analysis according to one embodiment of the present invention. As shown in FIG. 3, the D-band 60 of the Raman shift is at 1333 cm$^{-1}$, and the G-band 61 of the Raman shift is at 1581 cm$^{-1}$. The $I_G/I_D$ is therefore 1.014. This means that the carbon nanotubes fabricated according to the present invention have superior crystallinity and the method of the present invention is practicable.

In conclusion, the present invention forms the catalyst layer 30 on the periphery of the hole 21 and grows the carbon nanotubes 40 between the catalytic layer 31 and upper covering layer 32 of the catalyst layer 30. The upper covering layer 32 protects the catalytic layer 31 from being oxidized and thus favors growth of the carbon nanotubes 40. Further, the carbon nanotubes 40 are respectively electrically connected with the lower substrate 10 and the upper conductive wire 50 via the catalytic layer 31 and the upper covering layer 32. The present invention is realized with simplified steps and thus can reduce the cost of the semiconductor fabrication process. Furthermore, the catalyst layer 30 exempts the catalytic layer 31 from directly contacting oxygen and thus reduces the probability of resistance increase. Moreover, the upper covering layer 32 also functions as a copper-diffusion barrier layer to avoid copper diffusion from the substrate 10 or the conductive wire 50.

The present invention is proved to possess utility, novelty and innovativeness and meets the condition for a patent. Thus, the Inventor files the application for a patent. It is appreciated if the patent is approved fast.

The embodiments described above are only to exemplify the present invention, not to limit the scope of the present invention. Any equivalent modification or variation according to the spirit of the present invention is to be also included within the scope of the present invention.

What is claimed is:

1. A method for fabricating interconnections with carbon nanotubes, comprising steps of:
   forming an insulating layer on a substrate and forming a hole on the insulating layer connecting with the substrate;
   forming a catalyst layer on the periphery of the hole that includes a catalytic layer and an upper covering layer, where the catalyst layer is connected with the substrate and the insulating layer; and
   growing carbon nanotubes in the hole, wherein the carbon nanotubes are grown between the catalytic layer and the upper covering layer, and the upper covering layer covers the carbon nanotubes and is connected with a conductive wire arranged at one side opposite to the substrate.

2. The method according to claim 1 further comprising a step of forming an etch stop layer on the substrate, and the etch stop layer being made of silicon nitride.

3. The method according to claim 1, wherein the catalytic layer is made of cobalt or nickel.

4. The method according to claim 1, wherein the upper covering layer is made of tantalum.

5. The method according to claim 1, wherein the carbon nanotubes are grown in the hole with a chemical vapor deposition method.

6. The method according to claim 1 further comprising a step of removing an amorphous carbon self-growth layer spontaneously grown from the carbon nanotubes.

7. The method according to claim 1, wherein the substrate is made of a conductive material, and the insulating layer is made of a material selected from a group consisting of silicon dioxide, carbon-containing low-permittivity insulating materials, fluorine-containing low-permittivity insulating materials, and porous low-permittivity insulating materials.

* * * * *